US010355787B2

United States Patent
Noguchi

(10) Patent No.: US 10,355,787 B2
(45) Date of Patent: Jul. 16, 2019

(54) DIGITAL OPTICAL RECEIVER AND OPTICAL COMMUNICATION SYSTEM USING THE SAME

(71) Applicant: NEC Corporation, Tokyo (JP)

(72) Inventor: Hidemi Noguchi, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 16/080,754

(22) PCT Filed: Mar. 2, 2017

(86) PCT No.: PCT/JP2017/008265
§ 371 (c)(1),
(2) Date: Aug. 29, 2018

(87) PCT Pub. No.: WO2017/150661
PCT Pub. Date: Sep. 8, 2017

(65) Prior Publication Data
US 2019/0109648 A1 Apr. 11, 2019

(30) Foreign Application Priority Data
Mar. 3, 2016 (JP) .................. 2016-040623

(51) Int. Cl.
*H04B 10/61* (2013.01)
*H04B 10/69* (2013.01)
(Continued)

(52) U.S. Cl.
CPC ............ *H04B 10/616* (2013.01); *H04B 3/06* (2013.01); *H04B 10/2507* (2013.01); *H03M 1/12* (2013.01)

(58) Field of Classification Search
CPC .................. H04B 10/6933; H04B 10/697
See application file for complete search history.

(56) References Cited

U.S. PATENT DOCUMENTS

| 2009/0142074 A1* | 6/2009 | Ide .................. H04B 10/69 398/202 |
| 2010/0209121 A1* | 8/2010 | Tanimura ............. H04B 10/611 398/202 |
| 2012/0280844 A1 | 11/2012 | Abe et al. |

FOREIGN PATENT DOCUMENTS

| JP | 5527832 B2 | 6/2014 |
| JP | 2016-208257 A | 12/2016 |

OTHER PUBLICATIONS

Wakako Maeda et al., "Optimization Method for Filter Coefficients in Adaptive Equalizer According to Time-varying Waveform Distortion," IEICE Technical Report, Oct. 29, 2015, pp. 53-57, vol. 115, No. 276.

(Continued)

*Primary Examiner* — Shi K Li
(74) *Attorney, Agent, or Firm* — Sughrue Mion, PLLC

(57) ABSTRACT

A digital optical receiver capable of adaptively correcting the linearity of an analog front end unit is provided. The digital optical receiver comprises: a photoelectric conversion unit that converts an optical signal into an analog electric signal and outputs the analog electric signal; an analog front end unit that converts the analog electric signal obtained from the photoelectric conversion unit into a digital electric signal and outputs the digital electric signal; a linearity correction unit that corrects the linearity of the digital electric signal obtained from the analog front end unit; a demodulation processing unit that demodulates a signal by using, as input, the digital electric signal obtained from the linearity correction unit; and a control unit that provides an offset signal to the analog electric signal outputted by the photoelectric conversion unit, obtains monitor information for the result of the provision of the offset signal, and controls the linearity correction unit so that the linearity correction unit corrects the linearity of the digital (Continued)

electric signal obtained from the analog front end unit on the basis of the monitor information.

20 Claims, 13 Drawing Sheets

(51) Int. Cl.
*H04B 3/06* (2006.01)
*H04B 10/2507* (2013.01)
*H03M 1/12* (2006.01)

(56) References Cited

OTHER PUBLICATIONS

Written Opinion of the International Searching Authority of PCT/JP2017/008265 dated May 23, 2017.
International Search Report of PCT/JP2017/008265 dated May 23, 2017.

\* cited by examiner

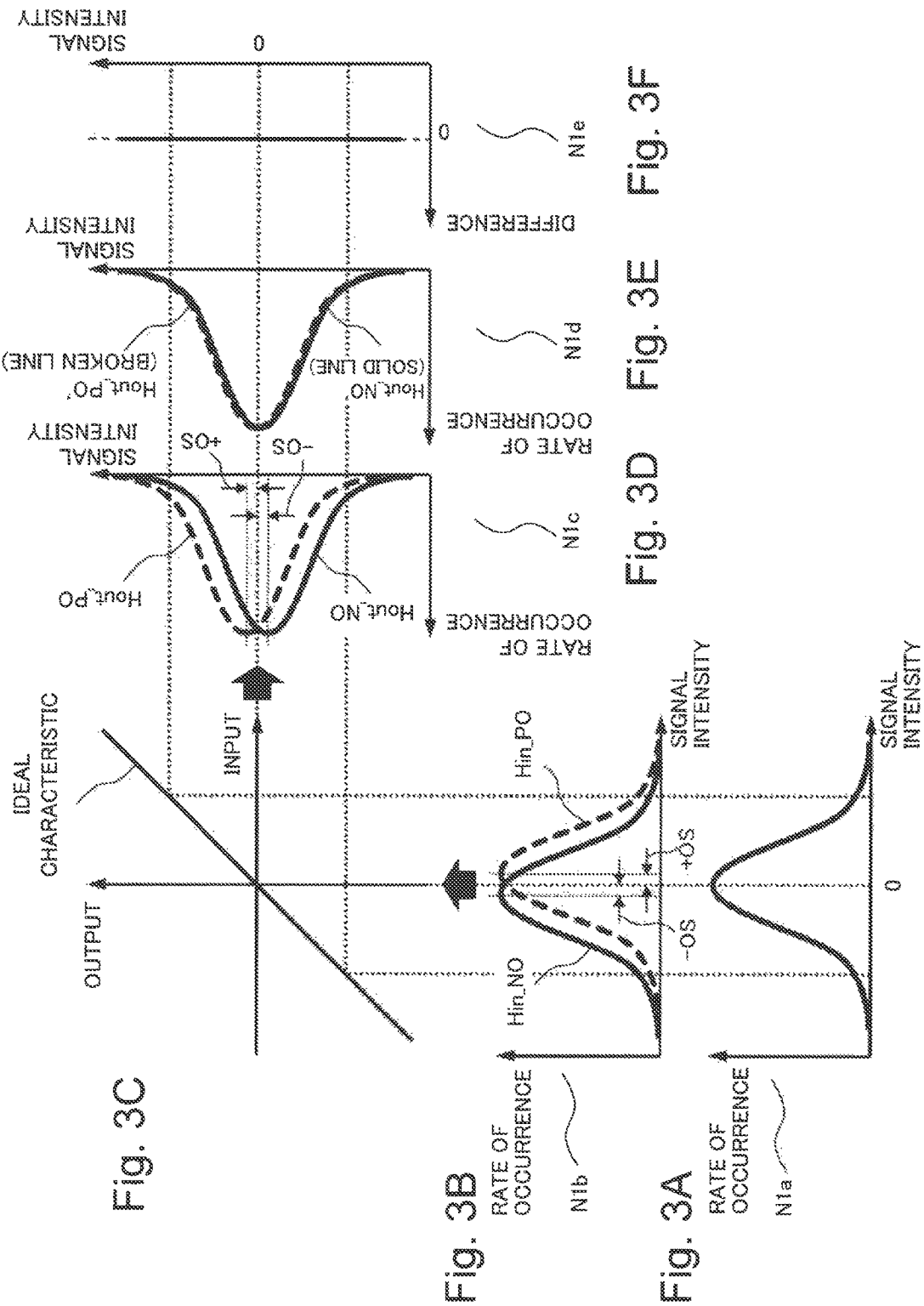

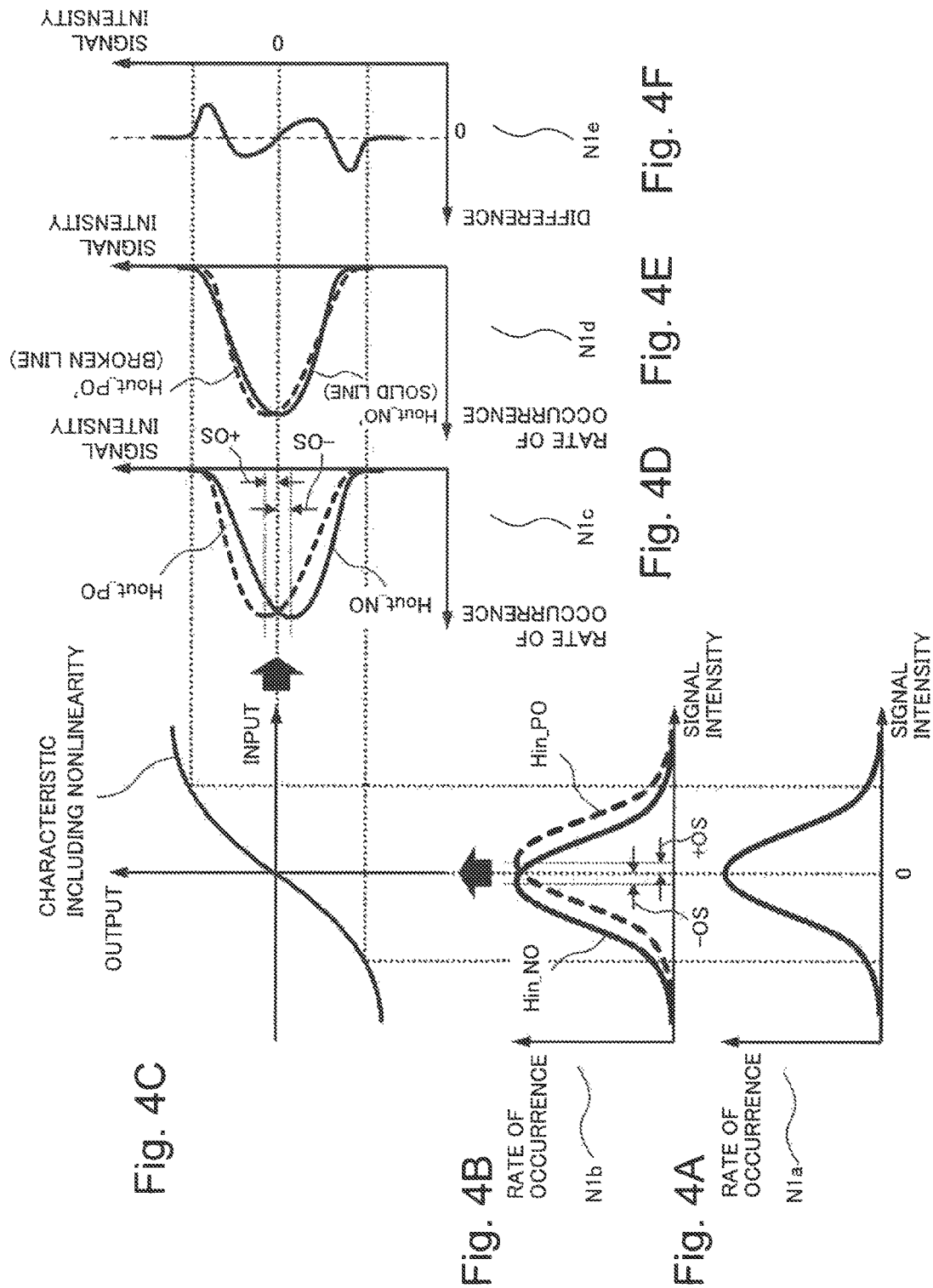

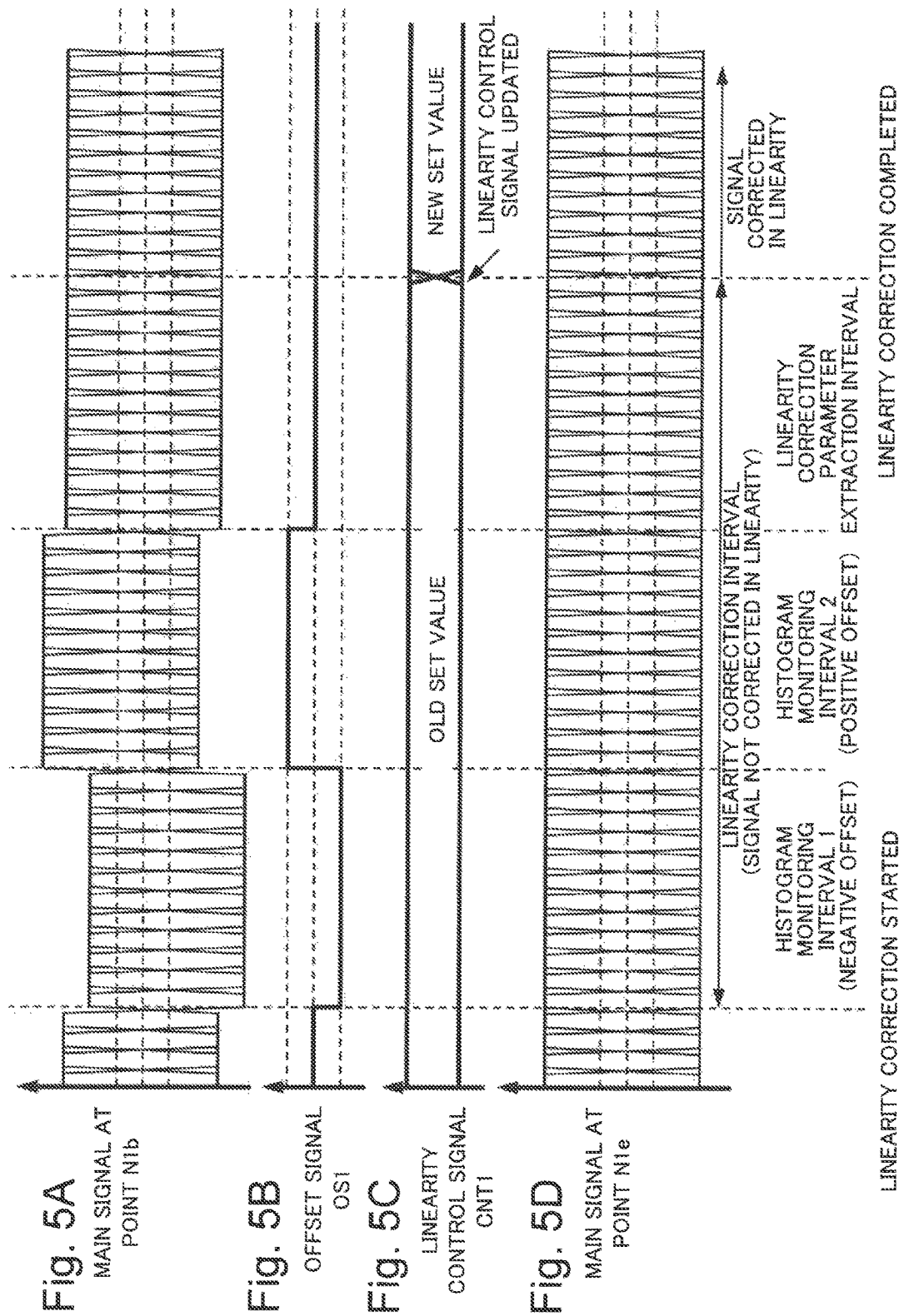

IDEAL STATE

LINEARITY DEGRADED

DIGITAL OPTICAL RECEIVER AND OPTICAL COMMUNICATION SYSTEM USING THE SAME

CROSS REFERENCE TO RELATED APPLICATIONS

This application is a National Stage of International Application No. PCT/JP2017/008265 filed Mar. 2, 2017, claiming priority based on Japanese Patent Application No. 2016-040623 filed Mar. 3, 2016, the disclosure of which is incorporated herein in its entirety by reference.

TECHNICAL FIELD

The present invention relates to a digital optical receiver and an optical communication system using the same and, more particularly, to a digital optical receiver of the digital coherent scheme and an optical communication system using the same.

BACKGROUND ART

With an explosive increase in demand for broadband multimedia communication services in such as the Internet and video distribution, the introduction of a long-distance, high-capacity, highly reliable optical fiber communication system is in progress.

In an optical fiber communication system, it is important to cut the installation cost of an optical fiber serving as an optical transmission line and improve the transmission band utilization efficiency per optical fiber. Under the circumstances, digital coherent optical communication technology using a digital optical transceiver is attracting a great deal of attention in recent years and growing in importance.

An optical communication system employs an analog optical transceiver using a hitherto widely applied modulation scheme such as OOK (On-Off Keying). In a digital coherent optical transceiver, even when it includes waveform distortion due to such as wavelength dispersion occurring in a transmission line or transceiver imperfectness, the distortion can be compensated for by performing DSP (digital signal processing) on the transmission or reception side.

Such technology improves the performance of an optical communication device and can achieve such as a low cost, and a high-capacity trunk optical communication system is thus becoming popular.

In particular, by taking advantage of digitization, a multilevel modulation technique such as QPSK (Quadrature Phase Shift Keying) modulation or QAM (Quadrature Amplitude Modulation) modulation that is hard to implement in analog processing becomes applicable. A technique for increasing the number of wavelength multiplexed channels by signal band narrowing using Nyquist filtering also becomes applicable. This improves the transmission band utilization efficiency, thus allowing a higher transmission capacity per optical fiber.

However, with the application of an advanced transmission scheme such as the aforementioned multilevel modulation technique or Nyquist filtering technique, the signal waveform becomes more complex, thus requiring a higher signal accuracy.

Characteristic degradation of an analog front end unit constituting a transceiver such as a transmission light modulator or a coherent detection receiver may therefore more significantly influence its transfer characteristic.

FIG. 10 is a block diagram illustrating the general configuration of a digital coherent optical receiver. The digital coherent optical receiver illustrated in FIG. 10 includes a photoelectric (O/E) conversion unit 101, a reception analog front end unit 102, and a digital demodulation processing unit 105.

The photoelectric (O/E) conversion unit 101 performs coherent detection by mixing an optical input signal and a local oscillator signal (LO light: Local-Oscillator light) together and converts four obtained optical signals (X-polarized I/Q signals and Y-polarized I/Q signals) into analog electric signals.

The reception analog front end unit 102 amplifies and converts the four analog electric signals into digital signals. The reception analog front end unit 102 is configured by including an amplifier 103 and an ADC (Analog-to-Digital Convertor) 104. The amplifier 103 amplifies each electric signal generated by optical/electrical conversion to an amplitude sufficient for signal processing. The analog-to-digital converter 104 converts each amplified analog electric signal into a digital signal. The analog-to-digital converter 104 will be referred to as an A/D converter 104 hereinafter. The digital demodulation processing unit 105 demodulates a signal using, as input, a digital signal corrected in linearity.

Examples in which characteristic degradation of the analog front end unit significantly influences its transfer characteristic, as described above, include the linearity of the reception analog front end unit. Such types of characteristic degradation result in distortion such as a deviation from an ideal constellation position or deformation, thus significantly degrading the transfer characteristic.

FIGS. 11A and 11B are diagrams illustrating specific examples of constellation distortion, in which FIG. 11A illustrates an ideal constellation, and FIG. 11B illustrates a constellation when the linearity has degraded in the input/output transfer characteristic of a reception front end unit. Note that the constellation defines the arrangement of signal points representing a combination of the phases and/or amplitudes of an in-phase channel (I channel) and a quadrature channel (Q channel) in a digital quadrature modulation scheme such as QPSK or 16-QAM.

It is a hitherto common practice to compensate for such linearity degradation of the reception analog front end unit by performing arithmetic processing of a characteristic inverse to the transfer characteristic of the reception analog front end unit in a reception digital signal processing unit, as illustrated in FIG. 12. FIG. 12 is a configuration diagram of the digital optical receiver in the background art, for correcting the linearity.

The digital optical receiver illustrated in FIG. 12 includes a photoelectric (O/E) conversion unit 101, a reception analog front end unit 102, and a digital demodulation processing unit 105, like the digital optical receiver illustrated in FIG. 10. The digital optical receiver illustrated in FIG. 12 further includes a linearity correction unit 106 and a control circuit 107 for the linearity correction unit. The linearity correction unit 106 imparts an arbitrary transfer characteristic to each of four digital signals and corrects the linearity of this digital signal. The control circuit 107 controls the amount of correction (correction parameter) of the linearity correction unit 106.

FIG. 13A illustrates, as an example, the input/output transfer characteristic of an amplifier 103 constituting the reception analog front end unit 102. FIG. 13B illustrates the inverse input/output transfer characteristic of the amplifier 103 constituting the reception analog front end unit 102, for distortion correction. An amplifier implemented as a transistor has a slightly curved input/output transfer characteristic, unlike an ideal characteristic indicated by a broken line, as illustrated in FIG. 13A.

The digital optical receiver in the background art illustrated in FIG. 12 includes a linearity correction unit 106 and a control circuit 107 that controls the linearity correction unit 106, and compensates for the linearity by performing arithmetic processing of a characteristic inverse to the transfer characteristic of the reception analog front end unit. The linearity correction unit 106 illustrated in FIG. 12 corrects the linearity by applying a characteristic inverse to the input/output transfer characteristic of the reception analog front end unit 102, that is, a correction function as illustrated in FIG. 13B. The linearity can be corrected when the input/output transfer characteristic of the reception analog front end unit 102 is static and known because, for example, this characteristic has been measured in advance.

Patent Literature 1 (PTL1) relates to a digital receiver and, more particularly, to control for an analog-to-digital converter that converts an analog electric signal from a photoelectric converter constituting a digital receiver into a digital signal. PTL1 proposes setting a plurality of identification levels used as a determination criterion in A/D conversion, in accordance with an identification level control signal from an identification level adjustment circuit.

CITATION LIST

Patent Literature

[PTL1] Japanese Patent No. 5527832
[PTL2] Japanese Laid-Open Patent Application No. 2016-208257

SUMMARY OF INVENTION

Technical Problem

However, the compensation technique illustrated in FIG. 12 poses the following issue. The amplifier 103 constituting the reception analog front end unit 102 generally performs a variable amplification operation for all input signal intensities, in which amplification takes place to a given amplitude matching the input dynamic range of the A/D converter 104. This is done to take full advantage of the resolution of the A/D converter 104 connected to the subsequent stage. In other words, the amplifier 103 constituting the reception analog front end unit 102 may change in amplification factor depending on the input signal intensity. In this case, the input/output transfer characteristic of the amplifier 103 is ideally perfectly linear for all possible amplification factors, but an actual transistor amplifier or the like not only has an input/output transfer characteristic suffering from distortion, albeit slightly, but also varies in amount of this distortion depending on the amplification factor. The amount of distortion even varies due, for example, to environmental variations or aging.

Since linearity degradation of the reception analog front end unit 102 dynamically varies due to a change in signal intensity in response to a change in path of optical transmission or variations in input/output transfer characteristic resulting from environmental variations, the background art technique is unavailable to cope with this situation.

In the compensation technique of the background art illustrated in FIG. 12, static linearity degradation of the transfer characteristic of the reception analog front end unit can be coped with by compensation upon, for example, activation of an optical communication device.

For dynamic linearity characteristic degradation, a means is necessary for temporarily interrupting a signal conduction state to measure the amount of compensation, measuring the transfer characteristic of the reception analog front end unit, and performing inverse correction, each time. For example, the amplifier constituting the reception analog front end unit uses a variable amplifier circuit for always performing linear amplification to a given amplitude even when the input signal power varies upon a change in transmission path, environmental variation or the like. The variable amplifier circuit generally changes in input/output transfer characteristic upon a change in amplification factor and, in turn, changes in degree of linearity degradation. Therefore, the background art technique cannot cope with dynamically varying linearity degradation without interrupting the signal conduction state. In other words, it is difficult for the background art technique to monitor linearity degradation of the reception analog front end unit in the background and correct it, without interrupting the signal conduction state. The same applies to PTL1.

It is an object of the present invention to provide a digital optical receiver capable of adaptively correcting the linearity of an analog front end unit, a method for controlling the digital optical receiver, and an optical communication system using the digital optical receiver.

Solution to Problem

To achieve the above-mentioned object, a digital optical receiver according to the present invention includes:

a photoelectric conversion unit that converts an optical signal into an analog electric signal and outputs the analog electric signal;

an analog front end unit that converts the analog electric signal obtained from the photoelectric conversion unit into a digital electric signal and outputs the digital electric signal;

a linearity correction unit that corrects linearity of the digital electric signal obtained from the analog front end unit by applying an arbitrary transfer function using the digital electric signal as input;

a demodulation processing unit that demodulates a signal using the corrected digital electric signal as input; and a control unit that provides an offset signal to the analog electric signal output by the photoelectric conversion unit, obtains monitor information for a result of providing the offset signal, and controls the linearity correction unit so that the linearity correction unit corrects the linearity of the digital electric signal obtained from the analog front end unit, based on the monitor information.

An optical communication system according to the present invention, including a digital optical receiver having:

a photoelectric conversion unit that converts an optical signal into an analog electric signal and outputs the analog electric signal;

an analog front end unit that converts the analog electric signal obtained from the photoelectric conversion unit into a digital electric signal and outputs the digital electric signal;

a linearity correction unit that corrects linearity of the digital electric signal obtained from the analog front end unit by applying an arbitrary transfer function using the digital electric signal as input; and a demodulation processing unit that demodulates a signal using the corrected digital electric signal as input, wherein an offset signal is added to the analog electric signal output by the photoelectric conversion unit;

monitor information for a result of providing the offset signal is obtained; and the linearity correction unit is controlled so that the linearity correction unit corrects the linearity of the digital electric signal obtained from the analog front end unit, based on the monitor information.

A method for controlling a digital optical receiver according to the present invention, including: an analog front end unit; and a linearity correction unit that corrects linearity of the digital electric signal obtained from the analog front end unit by applying an arbitrary transfer function using the digital electric signal as input, the method comprises:

providing an offset signal to a signal input to the analog front end unit;

obtaining monitor information for a result of providing the offset signal; and controlling the linearity correction unit so that the linearity correction unit corrects the linearity of the digital electric signal obtained from the analog front end unit, based on the monitor information.

A program for controlling a digital optical receiver according to the present invention, including: an analog front end unit; and a linearity correction unit that corrects linearity of the digital electric signal obtained from the analog front end unit by applying an arbitrary transfer function using the digital electric signal as input, the program causing a computer to perform processes of:

providing an offset signal to a signal input to the analog front end unit;

obtaining monitor information for a result of providing the offset signal; and controlling the linearity correction unit so that the linearity correction unit corrects the linearity of the digital electric signal obtained from the analog front end unit, based on the monitor information.

Advantageous Effect of Invention

The present invention can provide a digital optical receiver capable of adaptively correcting the linearity of an analog front end unit.

BRIEF DESCRIPTION OF DRAWINGS

FIGS. 3A to 3F are operation explanatory graphs illustrating operations in an ideal state in the first example embodiment of the present invention.

FIGS. 4A to 4F are operation explanatory graphs illustrating operations in a state including linearity degradation in the first example embodiment of the present invention.

FIGS. 5A to 5D are timing charts for linearity correction in the first example embodiment of the present invention.

EXAMPLE EMBODIMENT

Preferred example embodiments of the present invention will be described below with reference to the drawings.

[Example Embodiment of Uppermost Concept]

Figure 1A:
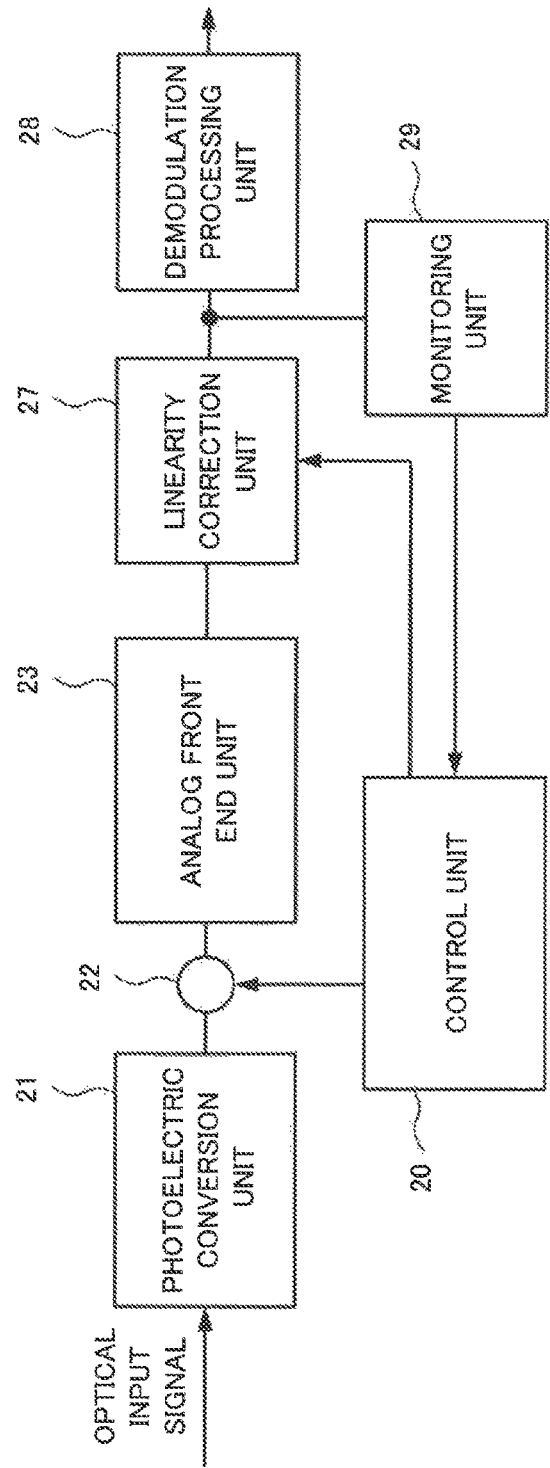
FIG. 1A is a configuration diagram of a digital optical receiver according to an example embodiment of the uppermost concept of the present invention.
Figure 1B:
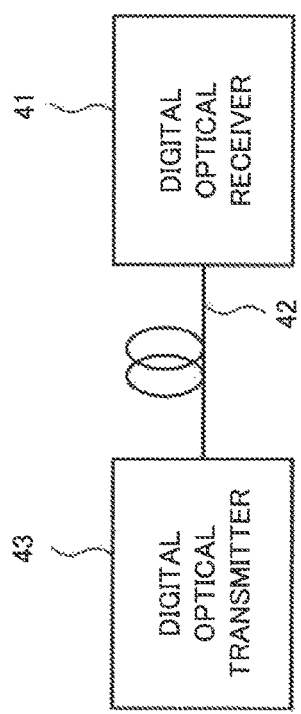
FIG. 1B illustrates an optical communication system including the digital optical receiver illustrated in FIG. 1A.

A digital optical receiver and an optical communication system according to an example embodiment of the uppermost concept of the present invention will be described first. FIG. 1A is a configuration diagram of a digital optical receiver in a digital coherent optical communication system according to this example embodiment, and FIG. 1B illustrates an optical communication system including the digital optical receiver illustrated in FIG. 1A. The directions of arrows in drawings associated with a description of each example embodiment of the present invention provide one example and do not limit the directions of signals between blocks.

The digital optical receiver illustrated in FIG. 1A includes a photoelectric conversion unit 21, an analog front end unit 23, a linearity correction unit 27, a demodulation processing unit 28, a monitoring unit 29, and a control unit 20. The digital optical receiver further includes an addition unit 22. The optical communication system illustrated in FIG. 1B includes a digital optical transmitter 43, a transmission line 42, and a digital optical receiver 41. An optical signal is transmitted from the digital optical transmitter 43, transferred via a transmission line 42 such as an optical fiber, and received by the digital optical receiver 41.

The photoelectric conversion unit 21 of the digital optical receiver illustrated in FIG. 1A converts an optical input signal into an analog electric signal. The analog front end unit 23 amplifies and converts the analog electric signal into a digital signal. The analog front end unit 23 is configured by including a function for amplifying an analog electric signal generated by optical/electrical conversion to an amplitude sufficient for signal processing, and a function of an analog-to-digital conversion for converting the amplified analog electric signal into a digital signal.

The linearity correction unit 27 illustrated in FIG. 1A imparts an arbitrary transfer characteristic to each digital signal and corrects the linearity of this digital signal. The demodulation processing unit 28 of the digital optical receiver illustrated in FIG. 1A demodulates a signal using, as input, the digital signal obtained from the linearity correction unit 27. The monitoring unit 29 monitors the digital signal fed to the demodulation processing unit 28. The control unit 20 adds an offset signal to the signal input to the analog front end unit 23 and monitors the amount by which a signal output from the analog front end unit 23 changes when the amount of offset of the offset signal is changed. In other words, the control unit 20 adds an offset signal to the analog electric signal output by the photoelectric conversion unit 21 and monitors the digital electric signal input to the demodulation processing unit 28. The control unit 20 controls the linearity correction unit 27 to correct the linearity of the digital electric signal output from the analog front end unit 23 in accordance with the monitoring result. More specifically, the control unit 20 instructs the addition unit 22 to add an offset signal to the analog electric signal output by the photoelectric conversion unit 21. The control unit 20 monitors the digital electric signal, input to the demodulation processing unit 28, after addition of an offset signal. The linearity correction unit 27 is controlled to correct the linearity of the digital electric signal output from the analog front end unit 23 in accordance with the monitoring result.

With the digital optical receiver according to this example embodiment, linearity degradation of the input/output characteristic in the analog front end unit 23 can be detected from a change in amount of monitoring. The linearity of the input/output characteristic (transfer characteristic) of the analog front end unit 23 can be improved by controlling the linearity correction unit 27, based on the amount of detected linearity degradation. As a result, the linearity of the input/output transfer characteristic of the analog front end unit 23 can be adaptively corrected. This can provide a digital optical receiver capable of adaptively correcting the linearity of an analog front end unit. An optical communication system that maintains a satisfactory signal quality can then be attained.

First Example Embodiment

Figure 2:
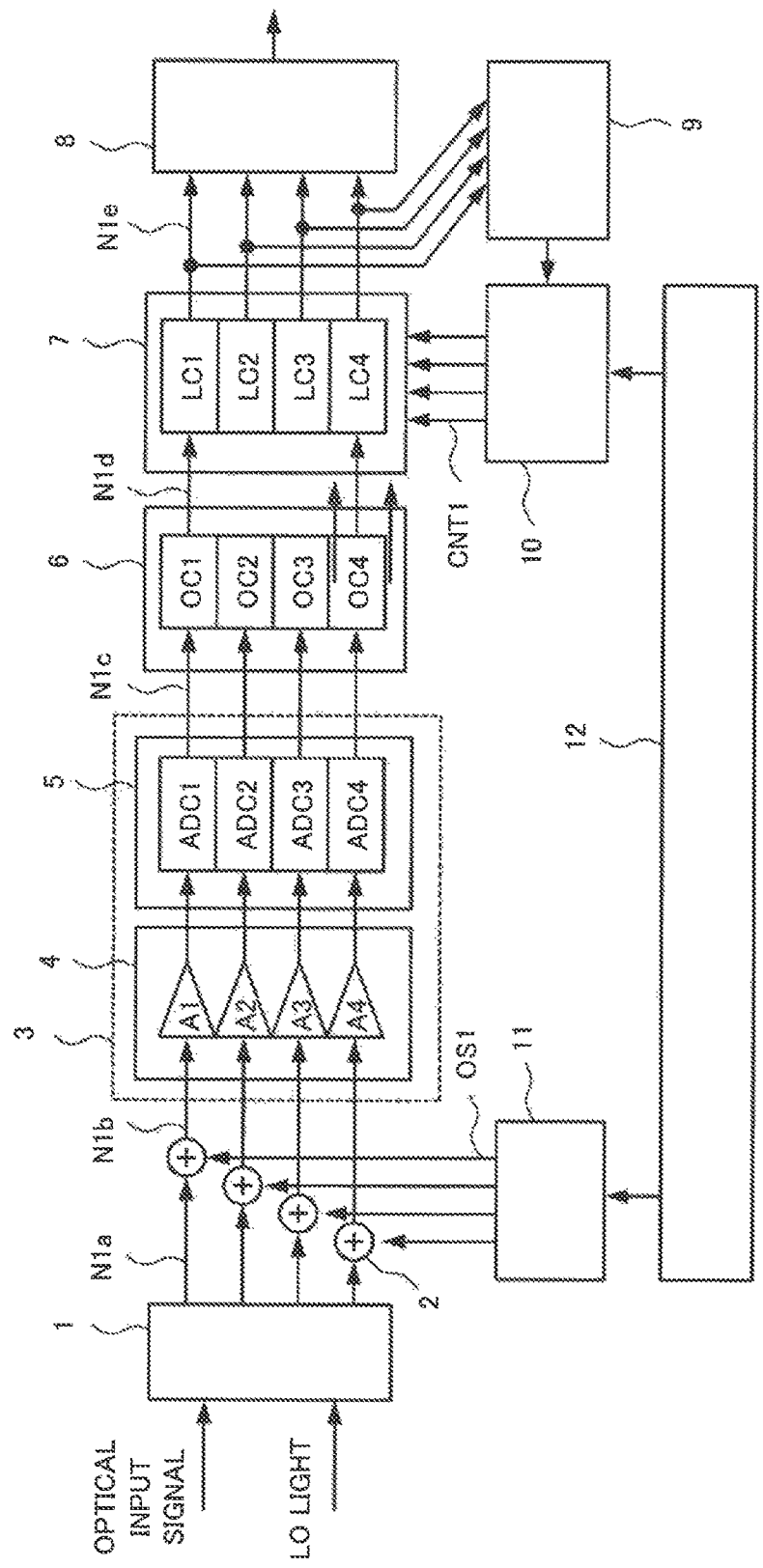
FIG. 2 is a configuration diagram of a digital optical receiver according to a first example embodiment of the present invention.

A digital optical receiver according to a first example embodiment of the present invention will be described below. FIG. 2 is a configuration diagram of a digital optical receiver in a digital coherent optical communication system according to this example embodiment.

The digital optical receiver illustrated in FIG. 2 includes an O/E (Optical/Electrical) conversion unit 1 as an example of a photoelectric conversion unit, a reception analog front end unit 3 as an example of an analog front end unit, and a digital demodulation processing unit 8 as an example of a demodulation processing unit. The digital optical receiver illustrated in FIG. 2 further includes an offset cancellation unit 6, a linearity correction unit 7, a linearity correction control circuit 10, a histogram monitor 9, an offset signal generation unit 11, an offset signal adder 2 as an example of an addition unit, and an overall control unit 12.

The O/E conversion unit 1 performs coherent detection by mixing an optical input signal and a local oscillator signal (LO light: Local-Oscillator light) together and converts four obtained optical signals (X-polarized I/Q signals and Y-polarized I/Q signals) into analog electric signals.

The reception analog front end unit 3 amplifies and converts the four analog electric signals into digital signals. The reception analog front end unit 3 includes an amplifier 4 and an ADC (Analog-to-Digital Convertor) 5. The amplifier 4 amplifies each electric signal generated by optical/electrical conversion to an amplitude sufficient for signal processing. FIG. 2 illustrates the amplifier 4, which includes four amplifiers A1 to A4. The analog-to-digital converter 5 converts each amplified analog electric signal into a digital signal. FIG. 2 illustrates the analog-to-digital converter 5, which includes four A/D converters ADC1 to ADC4.

The digital demodulation processing unit 8 demodulates the digital signals. The linearity correction unit 7 imparts an arbitrary transfer characteristic to each of the four digital signals and corrects the linearity of this digital signal. FIG. 2 illustrates the linearity correction unit 7, which includes four linearity correction units LC1 to LC4.

The histogram monitor 9 calculates the rates of occurrence of signals, that is, histograms for digital signals input to the digital demodulation processing unit 8, that is, four signals output from the linearity correction unit 7 and outputs histogram results.

The linearity correction control circuit 10 serves as a control circuit for controlling the linearity correction unit 7 and controls the amount of correction (correction parameter) of the linearity correction unit 7. More specifically, the amount of linearity degradation of the reception analog front end unit 3 is calculated from the histogram results acquired from the histogram monitor 9, and the correction parameter of the linearity correction unit 7 is controlled to minimize this amount of degradation.

The offset signal generation unit 11 generates an offset signal. The offset signal adder 2 adds the offset signal from the offset signal generation unit 11 to the analog electric signal output from the O/E conversion unit 1. The offset signal adder 2 respectively applies individual offset signals to the four analog electric signals.

The offset cancellation unit 6 cancels out the offset signals applied to the analog electric signals by the offset signal adder 2. FIG. 2 illustrates a case in which the offset cancellation unit 6 includes four offset cancellation units OC1 to OC4.

The overall control unit 12 performs overall control of linearity correction by controlling the offset signal generation unit 11 and the linearity correction control circuit 10.

A feature of the digital optical receiver according to this example embodiment illustrated in FIG. 2 lies in that the receiver has an offset signal generation unit 11 and an offset signal adder 2, and an offset cancellation unit 6 located in the preceding and subsequent stages of the reception analog front end unit 3. Another feature lies in that the digital optical receiver has each control circuit that adaptively controls the histogram monitor 9 and the linearity correction unit 7 by calculating the amount of linearity degradation from a monitoring result generated by the histogram monitor 9.

A more specific operation will be described below with reference to the drawings. The case where the input/output transfer characteristic of the reception analog front end unit is ideal and that where the input/output transfer characteristic of the reception analog front end unit includes linearity degradation will be described herein.

First, FIGS. 3A to 3F illustrate operation explanatory graphs when the input/output transfer characteristic of the reception analog front end unit is ideal, that is, perfectly linear. A total of four analog signal systems after O/E conversion are present, but since they all have similar operation principles, the operation of only one system will be described below for the sake of simplicity.

FIG. 3A illustrates a histogram for an analog electric signal N1a as output after O/E conversion among signals in the digital optical receiver of the example embodiment illustrated in FIG. 2. The histogram means herein an occurrence probability distribution having the signal amplitude as its abscissa and is used assuming a signal that can be approximated by a normal distribution as an example in this case. Generally, upon optical fiber-based long-distance transmission, a received signal has a nearly random waveform and a histogram shape exhibiting a characteristic close to a normal distribution, due to the influence of wavelength dispersion, and this example is therefore given herein as an exemplary principle description. However, the histogram shape is not limited to a normal distribution.

FIG. 3B illustrates histograms for signals N1b when two types of offset signals in the positive and negative directions are applied to the signal N1a as offset signals OS1 by the offset signal generation unit 11 and the offset signal adder 2. As presented herein, when a negative offset represented by an offset signal OS1=−OS is applied, a histogram Hin_NO indicated by a solid line is generated. When a positive offset represented by an offset signal OS1=+OS is applied, a characteristic as represented by a histogram Hin_PO indicated by a broken line is generated. As presented herein, both histograms are the same in shape itself except that positive and negative offsets are respectively applied.

The amount of negative or positive offset applied as an offset signal is kept small enough to have little influence on the transfer characteristic of a main signal. This amount of offset depends on, for example, the scheme, purpose of use, transmission distance, or conditions of use of a communication system employing the technique of the present invention, or the architecture or performance of a subsequent digital demodulation processing unit, but it need only be about several percent of the maximum input signal amplitude in a scheme such as polarization-multiplexed QPSK.

FIG. 3C illustrates an ideal input/output transfer characteristic of the reception analog front end unit. As presented herein, the relationship between input and output exhibits a perfectly linear characteristic. FIG. 3D illustrates histograms for signals N1c after passage through the reception analog front end unit exhibiting perfect linearity illustrated in FIG. 3C. A main signal applied with a negative offset signal is converted into a histogram represented by Hout_NO by the reception analog front end unit, while a main signal applied with a positive offset is converted into a histogram represented by Hout_PO by the reception analog front end unit. As is obvious from FIG. 3D, when the input/output transfer characteristic of the reception analog front end unit has perfect linearity, both of the histograms Hout_NO and Hout_PO of the signal N1c have the same shape, similarly to FIG. 3B. In other words, both of the histograms Hout_NO and Hout_PO of the signal N1c have the same shape, similarly to FIG. 3B, although applied with negative and positive offsets, respectively.

FIG. 3E illustrates histograms for signals N1c output from the offset cancellation unit 6 that cancels out the applied offset signals. As presented herein, the two histograms illustrated in FIG. 3D match each other, as represented by Hout_NO' and Hout_PO', upon offset cancellation. This means nothing other than that the input/output transfer characteristic of the reception analog front end unit, described earlier, is a perfectly linear ideal characteristic, and the two histograms have the same shape.

FIG. 3F illustrates the difference between the two histograms Hout_NO' and Hout_PO'. Similarly in this case, since both histograms are identical, their difference is zero.

FIGS. 4A to 4F similarly illustrate operations when the input/output transfer characteristic of the reception analog front end unit includes linearity degradation.

FIG. 4A illustrates a histogram for an analog electric signal N1a as output after O/E conversion. FIG. 4B illustrates histograms for signals N1b after offset signals OS1 are applied to the signal N1a by the offset signal generation unit 11 and the offset signal adder 2. FIGS. 4A and 4B are exactly identical to FIGS. 3A and 3B described above.

FIG. 4C illustrates an exemplary input/output transfer characteristic of the reception analog front end unit including linearity degradation. A histogram for a signal N1c transformed by such a characteristic including linearity degradation exhibits different shapes when a negative offset signal is applied and when a positive offset signal is applied, as illustrated in FIG. 4D. A histogram for a signal N1d after offset cancellation, in turn, exhibits different shapes between negative and positive offsets, as illustrated in FIG. 4E, and the two histogram shapes differ from each other, unlike FIG. 3E. Hence, an error component appears in the difference between the two histograms Hout_NO' and Hout_PO' in accordance with the shape of linearity degradation, as illustrated in FIG. 4F.

As described above, upon application of two different offset signals to the preceding stage of the reception analog front end unit, when the input/output transfer characteristic is perfectly linear, the histogram shapes of signals output from the reception analog front end unit perfectly match each other, and the difference between the two histograms is accordingly zero. When the input/output transfer characteristic of the reception analog front end unit includes any linearity degradation characteristic, the histogram shapes of signals output from the reception analog front end unit differ from each other, and a difference accordingly occurs between the two histograms. Therefore, calculating the difference information between the histograms allows estimation of the amount of linearity degradation of the reception analog front end unit.

The linearity correction control circuit 10 therefore controls the correction parameter of the linearity correction unit 7 to set the difference between the two histograms to zero using a monitoring result generated by the histogram monitor 9. This can compensate for linearity degradation of the reception analog front end unit.

FIGS. 5A-5D illustrate specific timing charts for correcting the linearity of the reception analog front end unit 3, based on the above-mentioned operation principle. FIG. 5A schematically illustrates a main signal in N1b of a stage immediately preceding the reception analog front end unit 3. FIG. 5B illustrates an offset signal OS1 applied to the main signal. FIG. 5C schematically illustrates a linearity control signal CNT1 for controlling the linearity correction unit 7. The linearity control signal CNT1 means herein the correction parameter (amount of correction) itself of the linearity correction unit 7 and is, for example, a digital control signal having a plurality of bits. FIG. 5D schematically illustrates a signal after linearity correction, that is, a main signal in a signal N1e of a stage immediately preceding the subsequent digital demodulation processing unit 8.

There are three time intervals: histogram monitoring intervals 1 and 2 and a linearity correction parameter extraction interval. As a procedure for linearity correction, a series of linearity correction sequences continues after processing in the three intervals until processing for updating the linearity correction parameter.

As presented in the above-described operation principle, first, in histogram monitoring interval 1, a negative offset signal is generated as an offset signal to be applied and is applied to a main signal. The signal N1b accordingly shifts to the negative side, albeit slightly, as illustrated in FIG. 5A.

Conversion into a digital signal is performed via the reception analog front end unit 3, the applied offset signal is canceled out by the offset cancellation unit 6, and the linearity is corrected by the linearity correction unit 7. Note, however, that at this point of time, the correction parameter of the linearity correction unit 7 takes an old set value before linearity correction and, for example, is set without correction at the time of initial startup, as illustrated in FIG. 5C. With this series of processes, a main signal N1e finally transmitted to the subsequent digital demodulation processing unit 8 becomes a signal that is not corrected in linearity but has been canceled out in offset, that is, a signal without difficulty in subsequent digital modulation processing, as illustrated in FIG. 5D. In this case, a histogram Hout_NO upon negative offset application that is not corrected in linearity is measured by the histogram monitor 9.

In histogram monitoring interval 2, the offset signal to be applied is changed to a positive offset, and a histogram Hout_PO upon positive offset application is measured using a procedure similar to that in histogram monitoring interval 1.

In the linearity correction parameter extraction interval, the linearity correction control circuit 10 calculates difference information between the two histograms Hout_NO and Hout_PO acquired in above-mentioned histogram monitoring intervals 1 and 2 and extracts a linearity correction parameter. The correction parameter of the linearity correction unit 7 is controlled to set the difference between the above-mentioned two histograms Hout_NO and Hout_PO to zero.

Figure 10:
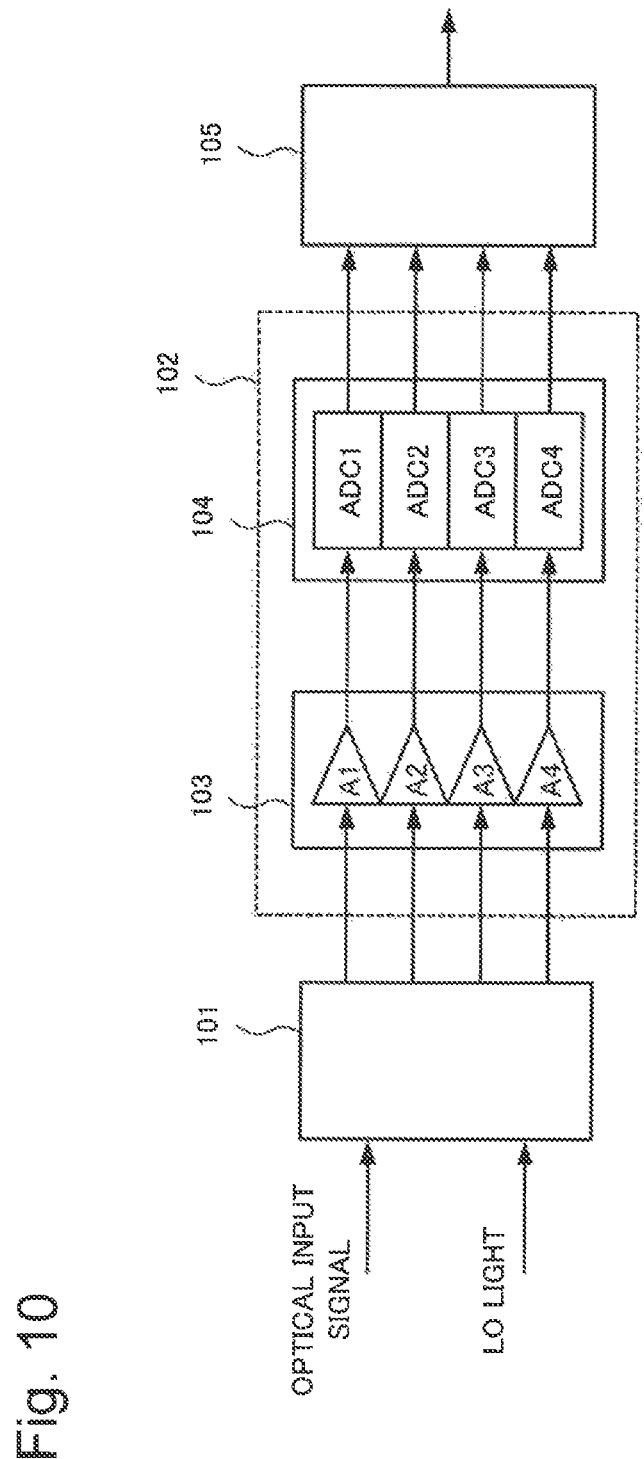
FIG. 10 is a configuration diagram of a general digital optical receiver.
Figure 11A:
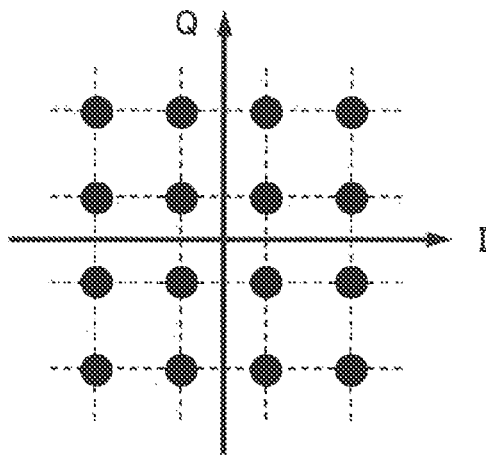
FIG. 11A is an explanatory diagram illustrating a specific example of a constellation in an ideal state.
Figure 11B:
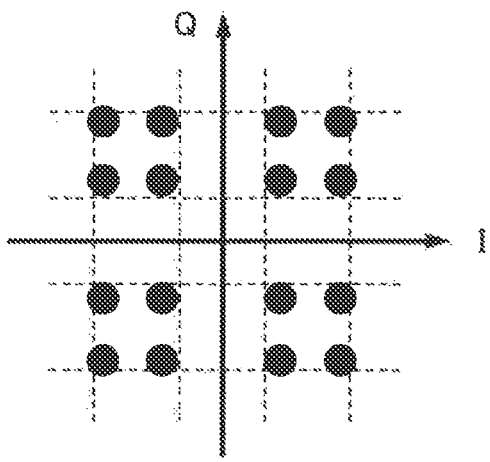
FIG. 11B is an explanatory diagram illustrating a specific example of constellation distortion when the linearity has degraded in the input/output transfer characteristic of a reception front end unit.
Figure 12:
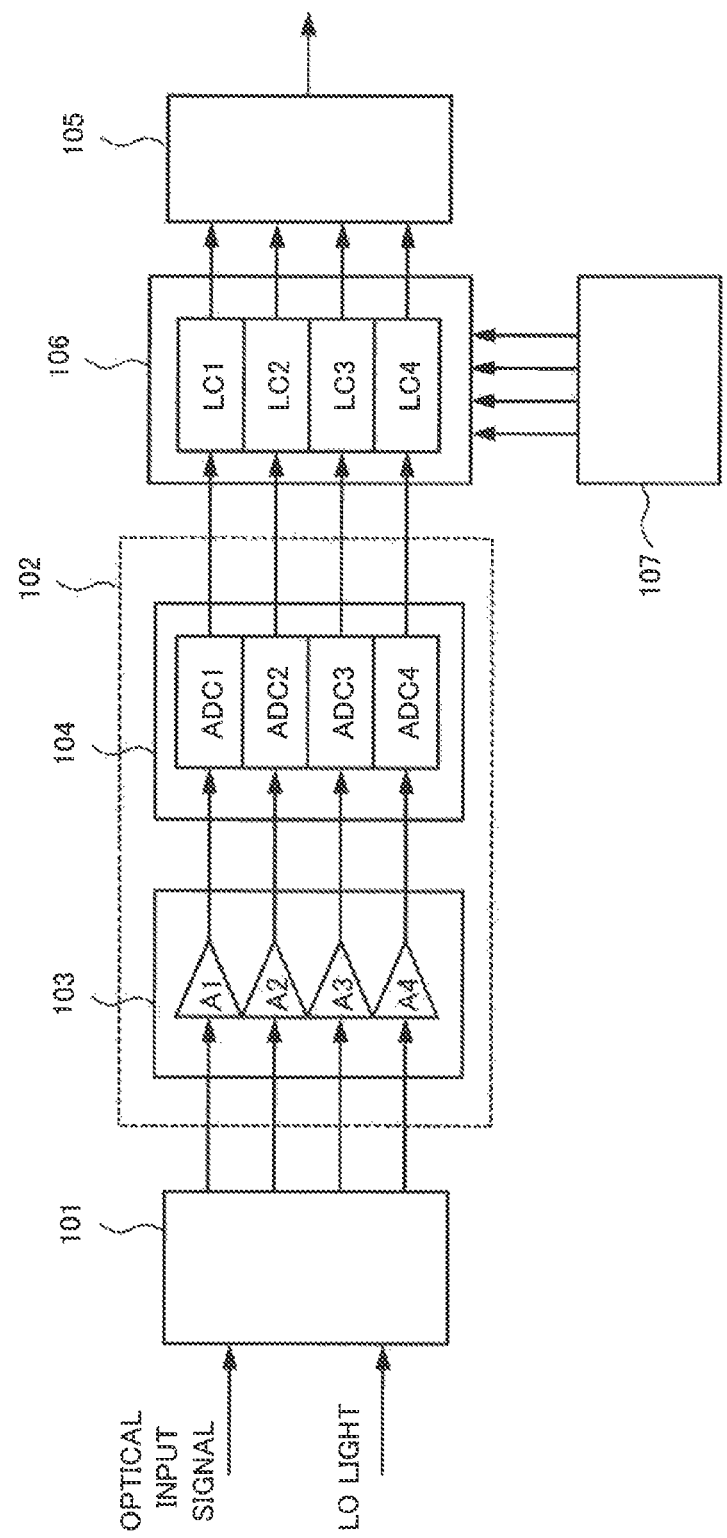
FIG. 12 is a configuration diagram of a digital optical receiver in the background art, which corrects the linearity of an analog front end unit.
Figure 13A:
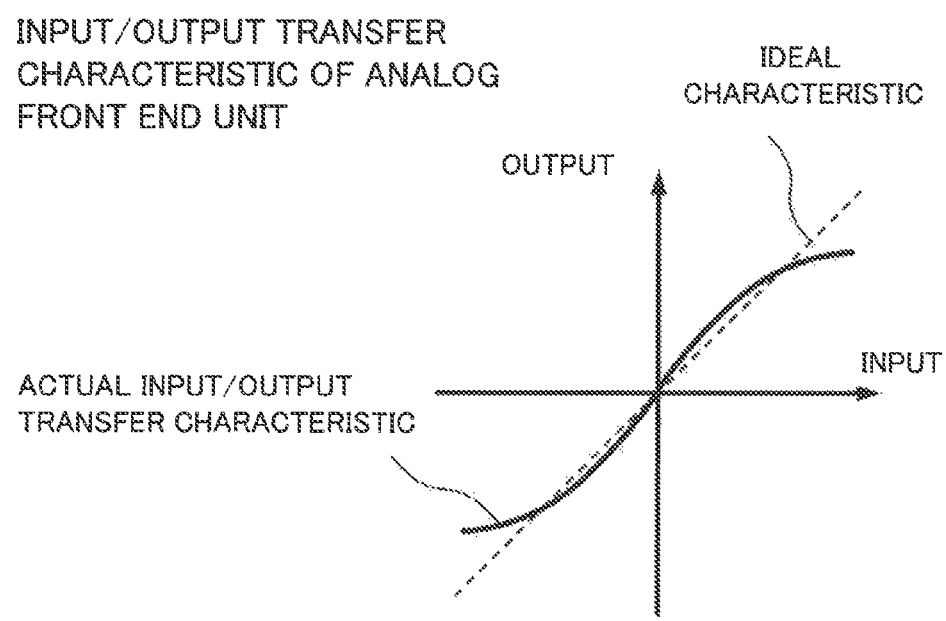
FIG. 13A is a graph illustrating an exemplary input/output transfer characteristic of a reception analog front end unit.
Figure 13B:
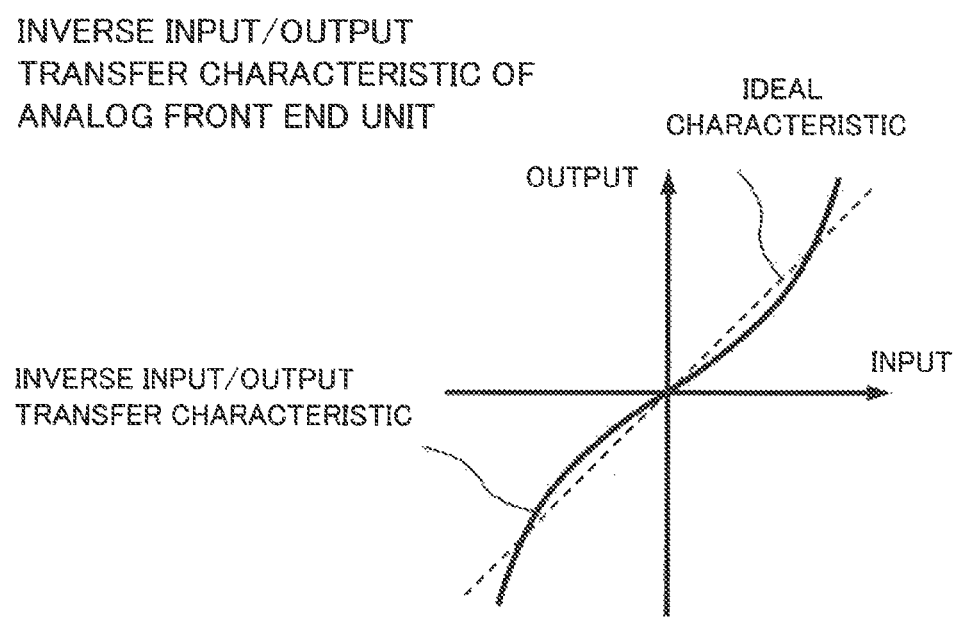
FIG. 13B is a graph illustrating an exemplary inverse input/output transfer characteristic of the reception analog front end unit.

A specific correction example will be explained below with reference to the drawings. FIG. 6A illustrates again the difference information between two histograms upon application of positive and negative offset signals illustrated in FIG. 4F. In addition, FIG. 6B illustrates a method based on processing for linear approximation in a plurality of intervals as an exemplary method for implementing specific inverse characteristic processing by the linearity correction unit 7. The linearity correction unit 7 freely corrects the linearity, based on information of n coordinate lookup tables (Xn, Yn). FIG. 10 of Patent Literature 2 (PTL2) also proposes a method for linearly approximating a curve as a set of respective intervals defined in such a plurality of coordinate lookup tables. In the histogram illustrated in FIG. 6A, therefore, the transfer characteristic need only be corrected with a positive shift when an error component appears in the negative direction and with a negative shift when an error component appears in the positive direction. Based on the histogram monitoring result, the linearity correction control circuit 10 calculates coordinate lookup table information representing its inverse characteristic as the correction parameter of the linearity correction unit 7 and controls the linearity correction unit 7. This control can correct the linearity of the reception analog front end unit 3.

Since it is difficult for an actual system to perfectly correct the linearity, a difference in histogram may remain, albeit slightly, and the correction parameter need only be controlled to set the difference as small as possible. Moreover, the above-mentioned linearity correction sequences may be executed not once but repeatedly. With this method, the accuracy of linearity correction may be gradually improved not by executing one linearity correction procedure that is insufficient for correction but by repeating such correction procedures. By slightly changing a coordinate lookup table having an inverse characteristic while monitoring a histogram error component (difference information), a lookup table may be calculated to minimize the error using a method, such as the hill-climbing method, while observing the direction and amount of change of error information.

Repeatedly executing the linearity correction sequences in this way can adaptively correct even linearity degradation that moderately varies with time.

With the above-mentioned operation, the digital optical receiver according to this example embodiment can maintain a satisfactory signal quality by correcting the linearity of the reception analog front end unit 3 in the background without interrupting the conduction state of a main signal.

With the digital optical receiver according to this example embodiment, even when dynamic linearity degradation occurs in the transfer characteristic of the reception analog front end unit 3, the amount of this linearity degradation is observed and inverse correction is adaptively performed in the background. This can maintain a satisfactory quality of a received signal and, in turn, maintain a given system performance.

In the above description, two types of offset signals ±OS having good symmetry are applied for the sake of simplicity, but the present invention is not limited to this. In other words, a signal need only be input to use two different regions for the input/output transfer characteristic, that is, two different offsets need only be applied. The offset signal to be applied need not always be a rectangular offset signal having points of discontinuity as illustrated in FIG. 5B.

In, for example, a slow sinusoidal wave having a period sufficiently longer than the time of a histogram monitoring interval, as long as the histogram monitoring interval is set in the neighborhood of the peak or bottom value of the sinusoidal wave to be applied, a nearly constant offset value can be regarded as having been added. Such an offset signal free from points of discontinuity can be used. This can correct the linearity while exerting as little influence as possible on the main signal characteristic. In this case, when the offset signal has discontinuity, this results in unpreferably making a discontinuous change in characteristic to the main signal. As long as the offset signal moderately varies in characteristic, the characteristic variations can be easily followed, and does not raise any systematic issue.

Moreover, although two types of offset signals ±OS are applied in this case, the number of types need not always be two. For example, control may be performed based on monitor information acquired by applying a plurality of more than two offsets. Thus, since more precise monitor information can be acquired, it is likely that a linearity correction parameter can be more accurately extracted.

Second Example Embodiment

A digital optical receiver according to a second example embodiment of the present invention will be described below. The main difference from the digital optical receiver according to the first example embodiment lies in the processing scheme of a linearity correction unit. Since components constituting the digital optical receiver according to the second example embodiment and connection between the components are similar to those in the digital optical receiver according to the first example embodiment, illustration of the digital optical receiver according to the second example embodiment is omitted.

Figure 6A:
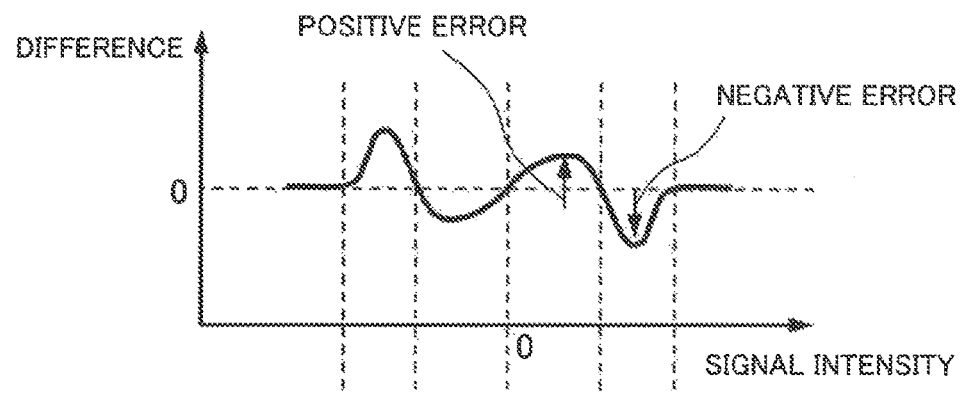
FIGS. 6A and 6B are graphs for explaining a specific operation of a linearity correction unit in the first example embodiment of the present invention.
Figure 6B:
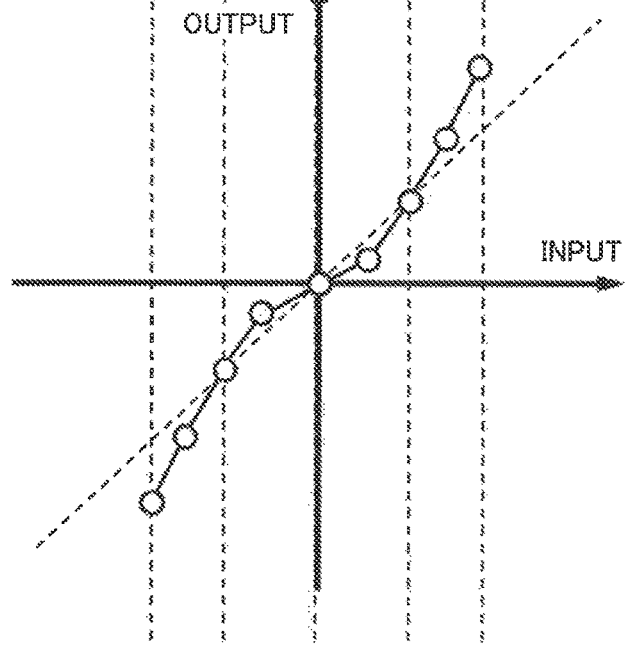
Figure 7A:
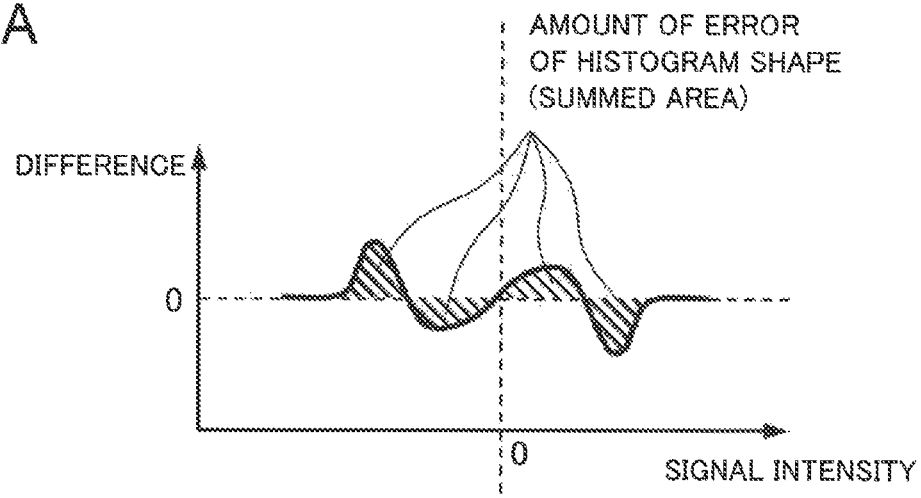
FIGS. 7A and 7B illustrate graphs for explaining a specific operation of a linearity correction unit in a digital optical receiver according to a second example embodiment of the present invention.

FIG. 7A illustrates again the difference information between two histograms upon application of positive and negative offset signals, like FIG. 6A referred to in the description of the first example embodiment, and FIG. 7A illustrates the area of error components by hatched portions. In this case, control is simplified by degenerating histogram error information into one-dimensional error information represented as an area. In other words, the correction parameter of the linearity correction unit need only be controlled to minimize this area. Note, however, that since only one-dimensional information (area) is available as error information, it may be unclear how to correct the input/output transfer characteristic. It is, therefore, difficult to uniquely calculate a correction parameter of the lookup table scheme as in the first example embodiment. For example, it is not impossible to monitor an area value as error information while changing the parameter of a lookup table and converge it using a method, such as the hill-climbing method, to minimize the area, as described earlier. However, setting a larger number of parameters forming a lookup table (more finely dividing intervals in interval linear approximation) makes it difficult for the simple hill-climbing method to obtain a convergence.

Figure 7B:
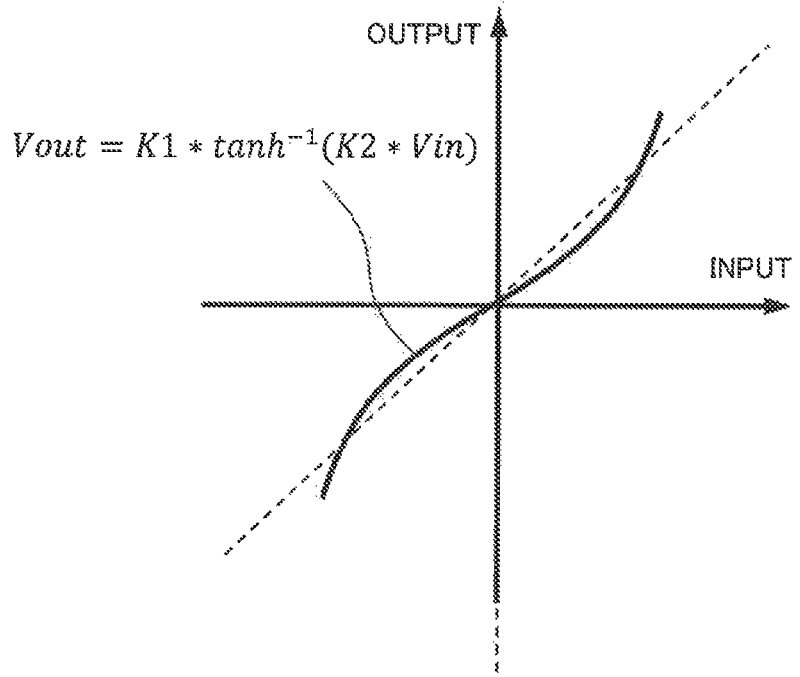

To solve this issue, in the second example embodiment of the present invention, an approximation scheme for an input/output transfer function, as illustrated in FIG. 7B, is used. FIG. 7B is a graph illustrating an exemplary inverse characteristic for specific inverse characteristic processing by the linearity correction unit in the second example embodiment.

In this case, assuming a characteristic approximated by a tan h function as the input/output transfer characteristic of an amplifier used for a reception analog front end unit 3, the linearity is corrected using a tan h$^{-1}$ function as a characteristic inverse to the former characteristic. The input/output transfer characteristic of a transistor differential amplifier commonly used as the amplifier is known to be capable of being generally approximated as a tan h function. A specific input/output transfer characteristic of the linearity correction unit, assuming the thus approximated characteristic, is given by:

$$V_{out} = K1 \cdot \tan h^{-1}(K2 * V_{in}) \quad \text{Equation (1)}$$

where K1 and K2 are correction parameters for inversely correcting the linearity. Unlike FIG. 6B of the first example embodiment, in this case, since an approximate function is used as an exemplary approximate expression, only two correction parameters K1 and K2 are used. Therefore, K1 and K2 can be easily calculated to minimize the area value illustrated in FIG. 7A, using an algorithm represented by the hill-climbing method or the like. In this case, repeatedly executing the series of linearity correction sequences illustrated in FIG. 5 can bring the values of K1 and K2 to optimum values and eventually yields an output result in which the linearity of the reception analog front end unit 3 is corrected.

An area is calculated as error information in this case, but the error information is not limited to this. A root-mean-square value correlated with area information, for example, may be used.

An example of correction using the fact that the input/output transfer characteristic of a transistor differential amplifier commonly used as the amplifier can be generally approximated as a tan h function has been given herein, but the correction is not limited to this. The input/output transfer characteristic need only be capable of being approximated by a transfer function of one or a plurality of parameters, and, for example, a polynomial approximation such as $V_{out} = a + b \cdot V_{in} + c \cdot V_{in}^2 + \ldots + m \cdot V_{in}^m$ can also be used, although a slightly larger number of correction parameters may be involved. (m is a number that allows convergence by the hill-climbing method or the like).

As described above, the digital optical receiver according to this example embodiment can maintain a satisfactory signal quality by correcting the linearity of the reception analog front end unit 3 in the background without interrupting the conduction state of a main signal, similarly to the first example embodiment. Furthermore, a linearity correction unit 7 allows similar linearity correction even by a method that uses approximation by a transfer function as in this example embodiment.

Third Example Embodiment

A digital optical receiver according to a third example embodiment exploiting linearity correction of the present invention will be described below. As described previously, according to each example embodiment of the present invention, even when the transfer characteristic of the reception analog front end unit includes a nonlinear characteristic, the linearity can be automatically corrected in the background. By exploiting this effect and, for example, combining the invention disclosed in PTL1 with any example embodiment of the present invention, the characteristic is expected to be more effectively improved.

PTL1 proposes setting a plurality of identification levels used as a determination criterion in A/D conversion to set a high resolution in a high signal density region and a low resolution in a low signal density region. PTL1 proposes improving the effective resolution of an A/D converter in this way. In PTL1, practical quantization noise is reduced in this way, thus improving the transfer characteristic. PTL1 proposes, as a specific example embodiment, intentionally deforming the transfer characteristic of the reception analog front end unit from a linear operation and performing analog-to-digital conversion, and then performing inverse characteristic processing of the transfer characteristic in digital signal processing and restoring it to a linear characteristic again.

Any example embodiment of the present invention may be applied to the processing for performing inverse characteristic processing of the transfer characteristic in digital signal processing and restoring it to a linear characteristic again, in PTL1. Such application can effectively improve the transfer characteristic.

Fourth Example Embodiment

Figure 8:
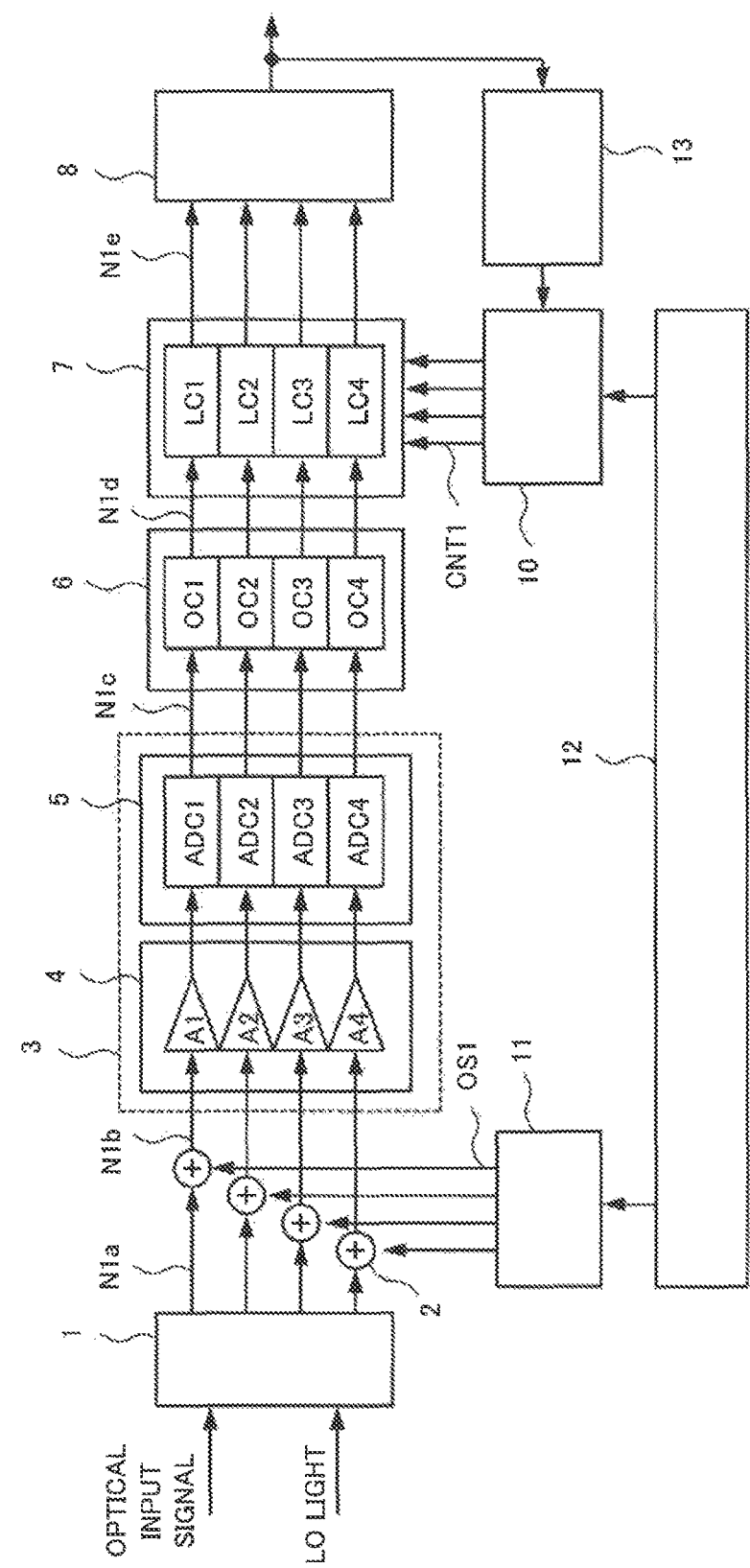
FIG. 8 is a configuration diagram of a digital optical receiver according to a fourth example embodiment of the present invention.

A digital optical receiver according to a fourth example embodiment of the present invention will be described below. FIG. 8 is a configuration diagram of a digital optical receiver in a digital coherent optical communication system according to this example embodiment. In the above-described first to third example embodiments, a histogram for a signal output from the linearity correction unit 7 is calculated, the amount of linearity degradation of the reception analog front end unit 3 is calculated from the histogram result, and the correction parameter of the linearity correction unit 7 is controlled to minimize the amount of this degradation. The main difference of this example embodiment from the digital optical receiver according to the first example embodiment lies in how to calculate the amount of linearity degradation of a reception analog front end unit 3. In this example embodiment, a linearity correction unit 7 is controlled to minimize the bit error rate, using bit error rate information of the output of a digital demodulation processing unit 8. The same reference numerals denote components similar to those constituting the digital optical receiver according to the first example embodiment, and a detailed description thereof will be omitted.

The digital optical receiver illustrated in FIG. 8 includes an O/E conversion unit 1, a reception analog front end unit 3, an offset cancellation unit 6, a linearity correction unit 7, a linearity correction control circuit 10, and an offset signal generation unit 11, similarly to the first example embodiment. The digital optical receiver illustrated in FIG. 8 further includes a digital demodulation processing unit 8, an offset signal adder 2, and an overall control unit 12, similarly to the first example embodiment.

The digital optical receiver illustrated in FIG. 8 further includes a bit error rate monitor 13. The bit error rate monitor 13 monitors the bit error rate of a digital signal demodulated and output by the digital demodulation processing unit 8 and outputs bit error rate information to the linearity correction control circuit 10. The linearity correction control circuit 10 controls the correction parameter of the linearity correction unit 7 using the bit error rate information. More specifically, the linearity correction control circuit 10 controls the linearity correction unit 7 to minimize the bit error rate.

Bit error rate monitoring will be supplementarily described herein. In general optical communication, an error is corrected using a technique called an FEC (Forward Error Correction) code. A special redundant signal (error correction code) for error correction is added in advance to transmission data to be sent, and on the reception side, an error is corrected by estimating the type of error occurring in a transmission line, based on the redundant signal. The redundancy used is, for example, about several percent to several ten percent (to send 100-Gbps data for 10-percent FEC, 10 percent of redundant bits are added and 110-Gbps data is sent). The higher the redundancy, the higher the error correction capability, and this technique is indispensable in, for example, long-distance transmission and can set a completely error-free state by correcting an error when, for example, the bit error rate is about 1E-3 (one error per 1,000 bits). In this case, in an error correction portion on the reception side, since the number of corrected bit errors can be determined, an approximate bit error rate before error correction can be guessed. Therefore, monitoring the information of a reception error correction unit (not illustrated) mounted in the digital optical receiver allows a guess of an approximate bit error rate without the information of transmission data.

Note that in linearity correction using a lookup table (LUT), an issue related to convergence may be posed in calculating a correction parameter by simple hill-climbing method or the like from one-dimensional bit error rate information. In this case, a correction parameter can be calculated even from one-dimensional bit error rate information by a linearity correction means using the approximate expression described in the second example embodiment.

According to this example embodiment, like the above-described example embodiments, a satisfactory signal quality can be maintained by correcting the linearity of the reception analog front end unit 3 in the background without interrupting the conduction state of a main signal.

In the digital optical receiver according to this example embodiment, like the above-described example embodiments, even when dynamic linearity degradation occurs in the transfer characteristic of the reception analog front end unit 3, the amount of this linearity degradation is observed and inverse correction is adaptively performed in the background. This can maintain a satisfactory quality of a received signal and, in turn, maintain a given system performance.

Other Example Embodiments

A method for controlling the above-mentioned digital optical receiver can also be implemented by an information processing apparatus capable of executing a program for implementing the above-mentioned configurations and operations. The program can be supplied in the form of a computer-readable recording medium. The functions of this example embodiment may be implemented as software by reading the program recorded on such a recording medium and causing the information processing apparatus to execute it.

Figure 9A:
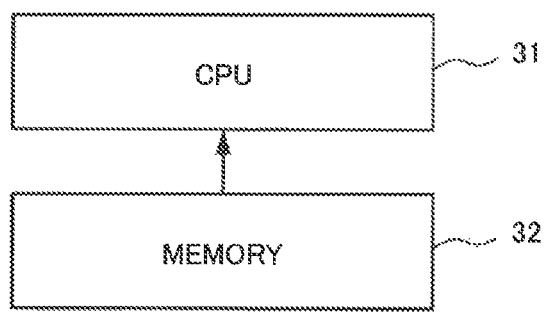
FIG. 9A illustrates another exemplary configuration of a control unit for a digital optical receiver according to other example embodiments of the present invention.

FIG. 9A is a diagram illustrating an exemplary configuration of a computer applicable to a method for controlling the digital optical receiver according to each example embodiment of the present invention. The direction of an arrow in the drawing provides one example and does not limit the direction of a signal between blocks.

Figure 9B:
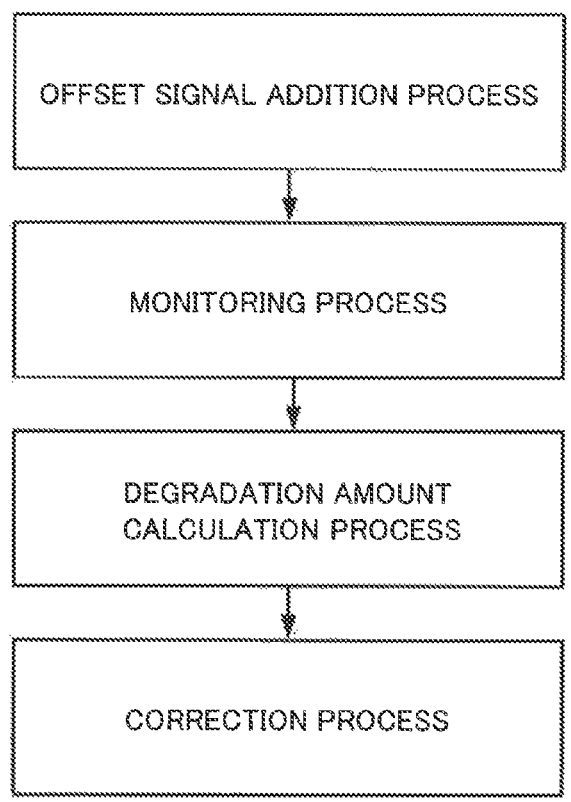
FIG. 9B is a flowchart for explaining processes by the control unit of the digital optical receiver according to other example embodiments of the present invention.

The information processing apparatus includes a CPU (Central Processing Unit) 31 and a memory 32 implemented as a RAM (Random Access Memory) or the like, as illustrated in FIG. 9A. The overall control unit 12 and the linearity correction control circuit 10 in each of the above-described example embodiments of the present invention can be implemented in the information processing apparatus having such a hardware configuration. In other words, a part or the whole of the overall control unit 12 and the linearity correction control circuit 10 illustrated in FIG. 2 can also be implemented by reading a program for executing each process as illustrated in FIG. 9B and causing the information processing apparatus to execute the program. Specific examples include an offset signal addition process for issuing instructions to the offset signal generation unit 11 and the offset signal adder 2, and a monitoring process of a digital signal input to the digital demodulation processing unit 8 after addition of an offset signal, as illustrated in FIG. 9B. Other specific examples include a degradation amount calculation process for calculating the amount of linearity degradation included in the input/output transfer characteristic of a reception analog front end unit 3, based on the monitoring result, and a correction process for controlling the correction parameter of the linearity correction unit 7 to minimize the calculated amount of linearity degradation, as illustrated in FIG. 9B.

The program can be supplied in the form of a recording medium recording the program. The program can be supplied in the form of, for example, a general-purpose semiconductor recording device such as CF (Compact Flash (Registered Trademark)) and SD (Secure Digital), a magnetic recording medium such as a flexible disk, or an optical recording medium such as a CD-ROM (Compact Disc Read Only Memory).

As described above, according to each example embodiment of the present invention, even when dynamic linearity degradation occurs in the transfer characteristic of the reception analog front end unit, the amount of this linearity degradation is observed and inverse correction is adaptively performed in the background. This can maintain a satisfactory quality of a received signal and, in turn, maintain a given system performance. This can implement a digital optical receiver capable of maintaining high quality of a received signal and an optical communication system using the same.

Since the use of each example embodiment of the present invention allows moderation in linearity performance required in a reception analog front end device, the yield of parts used can be improved and a low-cost digital optical receiver can be provided.

Preferred example embodiments of the present invention have been described above, but the present invention is not limited thereto. The digital optical receivers in the above-described first to fourth example embodiments can be applied to a digital optical receiver for an optical communication system as illustrated in FIG. 1B and constitute a part of the optical communication system. Various modifications can be made within the scope of the invention as described in the claims and are also encompassed by the present invention, as a matter of course.

Part or all of the above-described example embodiments may be described as in the following supplementary notes, but they are not limited thereto.

(Supplementary Note 1) A digital optical receiver including: an O/E conversion unit that performs detection by mixing an optical input signal and a local oscillator signal together and converts an optical signal into an electric signal; a reception analog front end unit including an amplifier that amplifies the electric signal and an analog-to-digital converter configured to convert an amplified analog signal into a digital; and a digital demodulation processing unit that demodulates the digital signal, the receiver including: an offset signal generation unit and an offset signal addition unit configured to apply an offset signal to a preceding stage of the reception analog front end unit; an offset cancellation unit that is located between the reception analog front end unit and the digital demodulation processing unit and cancels out the applied offset signal; a linearity correction unit that performs inverse characteristic processing of a transfer characteristic of the analog front end unit; a histogram monitoring unit that calculates a histogram for a signal after linearity correction; a linearity correction unit control circuit configured to calculate an amount of compensation for correcting linearity degradation of the reception analog front end unit from monitored histogram information and control the linearity correction unit; and an overall control unit that controls the offset signal generation unit and the linearity correction unit control circuit, wherein the linearity degradation of the reception analog front end unit is compensated for by controlling the linearity correction unit, based on difference information of the histogram generated by an amount of applied offset signal.

(Supplementary Note 2) The digital optical receiver according to supplementary note 1, wherein the linearity correction unit implements inverse characteristic processing of an input/output transfer characteristic of the reception analog front end unit, by a lookup table scheme using interval linear approximation.

(Supplementary Note 3) The digital optical receiver according to supplementary note 1, wherein the linearity correction unit implements inverse characteristic processing of an input/output transfer characteristic of the reception analog front end unit, by arithmetic operation using interval linear approximation implemented as transfer function approximation.

(Supplementary Note 4) In a digital optical receiver including: an O/E conversion unit that performs detection by mixing an optical input signal and a local oscillator signal together and converts an optical signal into an electric signal; a reception analog front end unit including an amplifier that amplifies the electric signal and an analog-to-digital converter configured to convert an amplified analog signal into a digital; and a digital demodulation processing unit that demodulates the digital signal, the receiver including: an offset signal generation unit and an offset signal addition unit configured to apply an offset signal to a preceding stage of the reception analog front end unit; an offset cancellation unit that is located between the reception analog front end unit and the digital demodulation processing unit and cancels out the applied offset signal; a linearity correction unit that performs inverse characteristic processing of a transfer characteristic of the analog front end unit; a histogram monitoring unit that calculates a histogram for a signal after linearity correction; a linearity correction unit control circuit configured to calculate an amount of compensation for correcting linearity degradation of the reception analog front end unit from monitored histogram information and control the linearity correction unit; and an overall control unit that controls the offset signal generation unit and the linearity correction unit control circuit, a digital optical reception scheme including: compensating for the linearity degradation of the reception analog front end unit by controlling the linearity correction unit, based on difference information of the histogram generated by an amount of applied offset signal.

(Supplementary Note 5) The digital optical reception scheme according to supplementary note 4, wherein the linearity correction unit implements inverse characteristic processing of an input/output transfer characteristic of the reception analog front end unit, by a lookup table scheme using interval linear approximation.

(Supplementary Note 6) The digital optical reception scheme according to supplementary note 4, wherein the linearity correction unit implements inverse characteristic processing of an input/output transfer characteristic of the reception analog front end unit, by arithmetic operation using interval linear approximation implemented as transfer function approximation.

(Supplementary Note 7) An optical transmission system using the digital optical receiver according to any one of supplementary notes 1 to 3 or the digital optical reception scheme according to any one of supplementary notes 4 to 6.

(Supplementary Note 8) A digital optical receiver including: a photoelectric conversion unit that converts an optical signal into an analog electric signal and outputs the analog electric signal; an analog front end unit that converts the analog electric signal obtained from the photoelectric conversion unit into a digital electric signal and outputs the digital electric signal; a linearity correction unit that corrects linearity of the digital electric signal obtained from the analog front end unit by applying an arbitrary transfer function using the digital electric signal as input; a demodulation processing unit that demodulates a signal using the corrected digital electric signal as input; and a control unit that provides an offset signal to the analog electric signal output by the photoelectric conversion unit, obtains monitor information for a result of providing the offset signal, and controls the linearity correction unit so that the linearity correction unit corrects the linearity of the digital electric signal obtained from the analog front end unit, based on the monitor information.

(Supplementary Note 9) The digital optical receiver according to supplementary note 8, wherein the offset signal includes a first offset signal and a second offset signal, the monitor information includes first monitor information and second monitor information, and the control unit controls the linearity correction unit so that the linearity correction unit corrects the linearity of the digital electric signal obtained from the analog front end unit, based on a difference between the first monitor information and the second monitor information.

(Supplementary Note 10) The digital optical receiver according to supplementary note 8 or 9, wherein a histogram is used as the monitor information.

(Supplementary Note 11) The digital optical receiver according to supplementary note 8 or 9, wherein a lookup table is used to correct the linearity of the digital electric signal obtained from the analog front end unit.

(Supplementary Note 12) The digital optical receiver according to supplementary note 8 or 9, wherein an approximate expression is used to correct the linearity of the digital electric signal obtained from the analog front end unit.

(Supplementary Note 13) The digital optical receiver according to supplementary note 8 or 9, wherein a bit error rate is used as the monitor information.

(Supplementary Note 14) The digital optical receiver according to supplementary note 8 or 9, wherein the demodulation processing unit performs inverse characteristic processing for a transfer characteristic for converting the analog electric signal obtained from the photoelectric conversion unit into a digital electric signal and outputting the digital electric signal by the analog front end unit.

(Supplementary Note 15) An optical communication system including the digital optical receiver according to any one of supplementary notes 8 to 14.

(Supplementary Note 16) A method for controlling a digital optical receiver including: an analog front end unit; and a linearity correction unit that corrects linearity of the digital electric signal obtained from the analog front end unit by applying an arbitrary transfer function using the digital electric signal as input, the method including: providing an offset signal to a signal input to the analog front end unit; obtaining monitor information for a result of providing the offset signal; and controlling the linearity correction unit so that the linearity correction unit corrects the linearity of the digital electric signal obtained from the analog front end unit, based on the monitor information.

(Supplementary Note 17) The method for controlling a digital optical receiver according to supplementary note 16, wherein the offset signal includes a first offset signal and a second offset signal, the monitor information includes first monitor information and second monitor information, and the linearity correction unit is controlled so that the linearity correction unit corrects the linearity of the digital electric signal obtained from the analog front end unit, based on a difference between the first monitor information and the second monitor information.

(Supplementary Note 18) The method for controlling a digital optical receiver according to supplementary note 16 or 17, wherein a histogram is used as the monitor information.

(Supplementary Note 19) The method for controlling a digital optical receiver according to supplementary note 16 or 17, wherein a lookup table is used to correct the linearity of the digital electric signal obtained from the analog front end unit.

(Supplementary Note 20) The method for controlling a digital optical receiver according to supplementary note 16 or 17, wherein an approximate expression is used to correct the linearity of the digital electric signal obtained from the analog front end unit.

(Supplementary Note 21) The method for controlling a digital optical receiver according to supplementary note 16 or 17, wherein a bit error rate is used as the monitor information.

(Supplementary Note 22) The method for controlling a digital optical receiver according to supplementary note 16 or 17, wherein by demodulation processing, inverse characteristic processing is performed for a transfer characteristic for converting the signal input to the analog front end unit into a digital electric signal and outputting the digital electric signal.

(Supplementary Note 23) A program for controlling a digital optical receiver including: an analog front end unit; and a linearity correction unit that corrects linearity of the digital electric signal obtained from the analog front end unit by applying an arbitrary transfer function using the digital electric signal as input, the program causing a computer to perform processes of: providing an offset signal to a signal input to the analog front end unit; obtaining monitor information for a result of providing the offset signal; and controlling the linearity correction unit so that the linearity correction unit corrects the linearity of the digital electric signal obtained from the analog front end unit, based on the monitor information.

(Supplementary Note 24) The program for controlling a digital optical receiver according to supplementary note 23, wherein the offset signal includes a first offset signal and a second offset signal, the monitor information includes first monitor information and second monitor information, and the linearity correction unit is controlled so that the linearity correction unit corrects the linearity of the digital electric signal obtained from the analog front end unit, based on a difference between the first monitor information and the second monitor information.

(Supplementary Note 25) The program for controlling a digital optical receiver according to supplementary note 23 or 24, wherein a histogram is used as the monitor information.

(Supplementary Note 26) The program for controlling a digital optical receiver according to supplementary note 23 or 24, wherein a lookup table is used to correct the linearity of the digital electric signal obtained from the analog front end unit.

(Supplementary Note 27) The program for controlling a digital optical receiver according to supplementary note 23 or 24, wherein an approximate expression is used to correct the linearity of the digital electric signal obtained from the analog front end unit.

(Supplementary Note 28) The program for controlling a digital optical receiver according to supplementary note 23 or 24, wherein a bit error rate is used as the monitor information.

(Supplementary Note 29) The program for controlling a digital optical receiver according to supplementary note 23 or 24, wherein by demodulation processing, inverse characteristic processing is performed for a transfer characteristic for converting the signal input to the analog front end unit into a digital electric signal and outputting the digital electric signal.

The present invention has been described above with reference to the above-described example embodiments as exemplary examples. However, the present invention is not limited to the above-described example embodiments. In other words, various modes which would be understood by those skilled in the art are applicable to the present invention within the scope of the present invention.

REFERENCE SIGNS LIST

1 O/E conversion unit
2 Offset signal adder

3 Reception analog front end unit
4 Amplifier
5 Analog-to-Digital Converter
6 Offset cancellation unit
7 Linearity correction unit
8 Digital demodulation processing unit
9 Histogram monitor
10 Linearity correction control circuit
11 Offset signal generation unit
12 Overall control unit
13 Bit error rate monitor
20 Control unit
21 Photoelectric conversion unit
22 Addition unit
23 Analog front end unit
27 Linearity correction unit
28 Demodulation processing unit
29 Monitoring unit
31 CPU
32 Memory

The invention claimed is:

1. A digital optical receiver comprising:
a photoelectric conversion unit that converts an optical signal into an analog electric signal and outputs the analog electric signal;
an analog front end unit that converts the analog electric signal obtained from the photoelectric conversion unit into a digital electric signal and outputs the digital electric signal;
a linearity correction unit that corrects linearity of the digital electric signal obtained from the analog front end unit by applying an arbitrary transfer function using the digital electric signal as input;
a demodulation processing unit that demodulates a signal using the corrected digital electric signal as input; and
a control unit that provides an offset signal to the analog electric signal output by the photoelectric conversion unit, obtains monitor information for a result of providing the offset signal, and controls the linearity correction unit so that the linearity correction unit corrects the linearity of the digital electric signal obtained from the analog front end unit, based on the monitor information.

2. The digital optical receiver according to claim 1, wherein
the offset signal includes a first offset signal and a second offset signal,
the monitor information includes first monitor information and second monitor information, and
the control unit controls the linearity correction unit so that the linearity correction unit corrects the linearity of the digital electric signal obtained from the analog front end unit, based on a difference between the first monitor information and the second monitor information.

3. The digital optical receiver according to claim 1, wherein
a histogram is used as the monitor information.

4. The digital optical receiver according to claim 1, wherein
a lookup table is used to correct the linearity of the digital electric signal obtained from the analog front end unit.

5. The digital optical receiver according to claim 1, wherein
an approximate expression is used to correct the linearity of the digital electric signal obtained from the analog front end unit.

6. The digital optical receiver according to claim 1, wherein
a bit error rate is used as the monitor information.

7. The digital optical receiver according to claim 1, wherein
the demodulation processing unit performs inverse characteristic processing for a transfer characteristic for converting the analog electric signal obtained from the photoelectric conversion unit into a digital electric signal and outputting the digital electric signal by the analog front end unit.

8. An optical communication system including the digital receiver according to claim 1.

9. A method for controlling a digital optical receiver including: an analog front end unit; and a linearity correction unit that corrects linearity of a digital electric signal obtained from the analog front end unit by applying an arbitrary transfer function using the digital electric signal as input, the method including:
providing an offset signal to a signal input to the analog front end unit;
obtaining monitor information for a result of providing the offset signal; and
controlling the linearity correction unit so that the linearity correction unit corrects the linearity of the digital electric signal obtained from the analog front end unit, based on the monitor information.

10. The method for controlling a digital optical receiver according to claim 9, wherein
the offset signal includes a first offset signal and a second offset signal,
the monitor information includes first monitor information and second monitor information, and
the linearity correction unit is controlled so that the linearity correction unit corrects the linearity of the digital electric signal obtained from the analog front end unit, based on a difference between the first monitor information and the second monitor information.

11. The method for controlling a digital optical receiver according to claim 9, wherein
a histogram is used as the monitor information.

12. The method for controlling a digital optical receiver according to claim 9, wherein
a lookup table is used to correct the linearity of the digital electric signal obtained from the analog front end unit.

13. The method for controlling a digital optical receiver according to claim 9, wherein
an approximate expression is used to correct the linearity of the digital electric signal obtained from the analog front end unit.

14. The method for controlling a digital optical receiver according to claim 9, wherein
a bit error rate is used as the monitor information.

15. The method for controlling a digital optical receiver according to claim 9, wherein
by demodulation processing, inverse characteristic processing is performed for a transfer characteristic for converting the signal input to the analog front end unit into a digital electric signal and outputting the digital electric signal.

16. A non-transitory program recording medium for controlling a digital optical receiver including: analog front end means; and linearity correction means for correcting linearity of a digital electric signal obtained from the analog front end means by applying an arbitrary transfer function using the digital electric signal as input, a program of the program recording medium causing a computer to perform processes of:

providing an offset signal to a signal input to the analog front end means;

obtaining monitor information for a result of providing the offset signal; and controlling the linearity correction means so that the linearity correction means corrects the linearity of the digital electric signal obtained from the analog front end means, based on the monitor information.

17. The non-transitory program recording medium for controlling a digital optical receiver according to claim 16, wherein the offset signal includes a first offset signal and a second offset signal, the monitor information includes first monitor information and second monitor information, and the linearity correction means is controlled so that the linearity correction means corrects the linearity of the digital electric signal obtained from the analog front end means, based on a difference between the first monitor information and the second monitor information.

18. The non-transitory program recording medium for controlling a digital optical receiver according to claim 16, wherein a histogram is used as the monitor information.

19. The non-transitory program recording medium for controlling a digital optical receiver according to claim 16, wherein a lookup table is used to correct the linearity of the digital electric signal obtained from the analog front end means.

20. The non-transitory program recording medium for controlling a digital optical receiver according to claim 16, wherein an approximate expression is used to correct the linearity of the digital electric signal obtained from the analog front end means.

* * * * *

UNITED STATES PATENT AND TRADEMARK OFFICE
CERTIFICATE OF CORRECTION

PATENT NO. : 10,355,787 B2
APPLICATION NO. : 16/080754
DATED : July 16, 2019
INVENTOR(S) : Hidemi Noguchi Page 1 of 1

It is certified that error appears in the above-identified patent and that said Letters Patent is hereby corrected as shown below:

In the Specification

Column 13, Example Embodiments, Line 26; Delete "tan h" and insert --tanh-- therefor Column 13, Example Embodiments, Line 28; Delete "tan h$^{-1}$" and insert --tanh$^{-1}$-- therefor Column 13, Example Embodiments, Line 32; Delete "tan h" and insert --tanh-- therefor Column 13, Example Embodiments, Line 37; Delete "$V_{out}=K1 \cdot tan\ h^{-1}(K2*V_{in})$" and insert --$V_{out}=K1 \cdot tanh^{-1}(K2*V_{in})$-- therefor Column 13, Example Embodiments, Line 59; Delete "tan h" and insert --tanh-- therefor In the Claims Column 22, Line 13; In Claim 8, before "receiver", insert --optical--

Signed and Sealed this
Fifth Day of November, 2019

Andrei Iancu
*Director of the United States Patent and Trademark Office*